(12) United States Patent
Elam et al.

(10) Patent No.: US 10,131,991 B2
(45) Date of Patent: Nov. 20, 2018

(54) METHOD FOR DEPOSITING TRANSPARENT CONDUCTING OXIDES

(75) Inventors: Jeffrey W. Elam, Elmhurst, IL (US); Joseph A. Libera, Clarendon Hills, IL (US)

(73) Assignee: UChicago Argonne, LLC, Chicago, IL (US)

( * ) Notice: Subject to any disclaimer, the term of this patent is extended or adjusted under 35 U.S.C. 154(b) by 315 days.

(21) Appl. No.: 12/895,305

(22) Filed: Sep. 30, 2010

(65) Prior Publication Data

US 2011/0206846 A1  Aug. 25, 2011

Related U.S. Application Data

(60) Provisional application No. 61/338,841, filed on Feb. 24, 2010.

(51) Int. Cl.
*C23C 16/455* (2006.01)
*C23C 16/40* (2006.01)

(52) U.S. Cl.
CPC ...... *C23C 16/45527* (2013.01); *C23C 16/407* (2013.01); *C23C 16/45553* (2013.01)

(58) Field of Classification Search
CPC ............. C23C 16/40; C23C 16/45525; C23C 16/45531
USPC ........................................ 427/255.32, 255.7
See application file for complete search history.

(56) References Cited

U.S. PATENT DOCUMENTS

| 5,147,688 A | * | 9/1992 | Melas | ................... C23C 16/407 |
| | | | | 427/109 |
| 6,061,117 A | | 5/2000 | Horie et al. | |
| 6,503,561 B1 | | 1/2003 | Senzaki | |
| 7,250,083 B2 | | 7/2007 | Sneh | |
| 2008/0175982 A1 | * | 7/2008 | Robinson et al. | ............... 427/74 |
| 2008/0286448 A1 | * | 11/2008 | Elam et al. | ................... 427/109 |

OTHER PUBLICATIONS

Asikainen et al., "AFM and STM Studies on In$_2$O$_3$ and ITO Thin Films Deposited by Atomic Layer Epitaxy", *Applied Surface Science*, (1996), pp. 91-98, vol. 99, Elsevier Science B.V.

Asikainen et al., "ALE Deposition of Indium Tin Oxide Thin Films", *Vacuum*, (1995), p. 887, vol. 46, Elsevier Science Ltd., Great Britain.

Asikainen et al., "Growth of In$_2$O$_3$ Thin Films by Atomic Layer Epitaxy", *J. Electrochem. Soc.*, Nov. 1994, pp. 3210-3213, vol. 141, No. 11, The Electrochemical Society, Inc.

(Continued)

*Primary Examiner* — Tabassom Tadayyon Eslami
(74) *Attorney, Agent, or Firm* — Foley & Lardner LLP

(57) ABSTRACT

A method of preparing light transmitting conducting metal oxide (TCO) films using atomic layer deposition (ALD) of a metal precursor multiple oxidizing reactants. The multiple metal oxidizing reactants may be selected to enhance growth of the TCO film. In a particular embodiment, an indium oxide TCO film is prepared using a cyclopentadienyl indium precursor and a combination of water and oxygen.

11 Claims, 11 Drawing Sheets

(56) References Cited

OTHER PUBLICATIONS

Asikainen et al., "Growth of Indium-Tin-Oxide Thin Films by Atomic Layer Epitaxy", *J. Electrochem. Soc.*, Oct. 1995, pp. 3538-3541, vol. 142, No. 10, The Electrochemical Society, Inc.
Bae et al., "Tin Oxide Films Deposited by Ozone-Assisted Thermal Chemical Vapor Deposition", *Jpn. J. Appl. Phys.*, (1999), pp. 2917-2920, vol. 38, No. 5A, Part 1, Publication Board, Japanese Journal of Applied Physics.
Elam et al., "Atomic Layer Deposition of $In_2O_3$ Using Cyclopentadienyl Indium: A New Synthetic Route to Transparent Conducting Oxide Films", *Chem. Mater.*, (2006), pp. 3571-3578, vol. 18, American Chemical Society.
Elam et al., "Atomic Layer Deposition of Indium Tin Oxide Thin Films Using Nonhalogenated Precursors", *J. Phys. Chem. C.*, (2008), pp. 1938-1945, vol. 112, American Chemical Society.
Elam et al., "Viscous Flow Reactor with Quartz Crystal Microbalance for Thin Film Growth by Atomic Layer Deposition", *Review of Scientific Instruments*, Aug. 2002, pp. 2981-2987, vol. 73, No. 8, American Institute of Physics.
Nilsen et al., Thin Films of $In_2O_3$ by Atomic Layer Deposition Using $In(acac)_3$, *Thin Solid Films*, (2009), pp. 6320-6322, vol. 517, Elsevier B.V.
Usuda et al., "High-Mobility $Ga_{0.47}In_{0.53}As/InP$ Heterostructure by Atmospheric-Pressure MOVPE Using Cyclopentadienyl Indium", *Journal of Electronic Materials*, (1996), pp. 407-409, vol. 25, No. 3.
Office Action dated Dec. 19, 2013 for U.S. Appl. No. 13/032,395.
Office Action dated Apr. 17, 2014 for U.S. Appl. No. 13/032,395.
Elam, et al., Atomic Layer Deposition of Tin Oxide Films Using Tetrakis(dimethylamino) Tin, J. Vac. Sci. Technol. A, vol. 26 No. 2, Mar. / Apr. 2008, pp. 244-252.

* cited by examiner

METHOD FOR DEPOSITING TRANSPARENT CONDUCTING OXIDES

CROSS REFERENCE TO RELATED PATENT APPLICATIONS

The present application claims priority to U.S. Provisional Patent Application No. 61/338,841, filed Feb. 24, 2010, and the contents of which are incorporated herein by reference in their entirety.

GOVERNMENT INTEREST

The United States Government has rights in this invention pursuant to Contract No. DE-AC02-06CH11357 between the United States Government and the UChicago Argonne, LLC, representing Argonne National Laboratory.

FIELD OF THE INVENTION

The present invention is directed to methods for deposition of transparent conducting oxide (TCO) coatings. More particularly, the invention is directed to a method for preparation of indium oxide, tin oxide, and indium-tin oxide which are transparent and exhibit low resistivity using atomic layer deposition.

BACKGROUND

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Indium oxide ($In_2O_3$) forms the basis of most of the transparent conducting oxides (TCO's) in use today. For example, indium-tin oxide (ITO) has found wide application in flat panel displays, solar glass, and energy efficient window coatings. Significantly, ITO exhibits a combination of excellent optical and transport properties as well as chemical stability.

ITO films can be deposited by various techniques, including sputtering, chemical vapor deposition, and by atomic layer deposition (ALD). In various applications, it can be helpful for device performance to have precise control over film thickness and composition, and some applications require the ability to coat high aspect ratio geometries or porous materials. The ALD process allows surfaces without line-of-sight access to the precursor sources to be coated with great uniformity. ALD also affords excellent control over both the thickness and the composition of the deposited film. These advantages facilitate the synthesis of TCO films for various applications, for example, nanostructured photovoltaics.

Although various techniques of ITO deposition by ALD have been developed, ALD of ITO films has generally not yet found commercial application. Indium oxide ($In_2O_3$) may be deposited using $InCl_3$ with either $H_2O$ or $H_2O_2$ as the oxygen source. Although useful for coating planar surfaces, this method suffers from several limitations. First, the $InCl_3$ chemistry requires high growth temperatures of ~300-500° C. and yields a low growth rate of only 0.25-0.40 Å/cycle. In addition, the $InCl_3$ has a low vapor pressure and must be heated to 285° C. just to saturate a planar surface. Furthermore, the corrosive HCl byproduct can damage deposition equipment. But the greatest limitation of the $InCl_3/H_2O$ method, especially for coating nanoporous materials, is that $InCl_3$ can etch the deposited $In_2O_3$. Consequently, the very long $InCl_3$ precursor exposures necessary to coat nanoporous materials can completely remove the $In_2O_3$ from the outer portions of the nanoporous substrate.

Alternative ALD processes for $In_2O_3$ and ITO have been sought for many years and a number of alternate precursors have been investigated including β-diketonates ($In(hfac)_3$ (hfac=hexafluoropentadionate), $In(thd)_3$ (thd=2,2,6,6-tetramethyl-3,5-heptanedioneate), and $In(acac)_3$ (acac=2,4-pentanedionate)) and trimethyl indium, ($In(CH_3)_3$). Unfortunately, these efforts were unsuccessful. No growth was observed using β-diketonates with water or hydrogen peroxide, while trimethyl indium did not yield self-limiting growth.

An improved ALD process for $In_2O_3$ and ITO is described in U.S. Pat. No. 7,709,056. The process utilizes alternating exposures to cyclopentadienyl indium (InCp) and ozone ($O_3$) to deposit monolayers of indium oxide, and alternating exposures to tetrakisdimethylamino tin and hydrogen peroxide to deposit monolayers of tin oxide. A potential limitation of a process that utilizes ozone is that the ozone precursor can decompose on hot surfaces and this may reduce ozone concentration in the ALD system, leading to thickness and composition non-uniformities. For example, in scaled applications where larger or multiple substrates are processed, thickness variation of ITO film deposited on the substrate can vary up to 33% over a length of 18 inches along the flow axis of the ALD reactor and up to 50% over a 11 inch span along the longitudinal axis. However, while an $InCp/O_3$ regime can achieve an acceptable growth rate of about 1.3 Angstrom per cycle, other oxidizing precursors including $O_2$, $H_2O$, $H_2O_2$, and $N_2O$, exhibit poor growth rates of about 0.16, 0.068, 0.039, and 0.065 Angstrom per cycle at deposition temperatures of between about 250-300° C. and exhibit no or virtually no growth at lower deposition temperatures.

Additionally, various new applications require the ability to deposit ITO, for example, at lower temperatures and/or onto higher aspect ratio substrates. Still further, these and existing applications would benefit from processes with improved economics for various commercial and large volume applications. Accordingly, there is a need to improve existing processes for deposition of TCO materials.

SUMMARY

A method is described for producing light transmitting (including light transparent) and highly conducting oxides using atomic layer deposition (ALD). The present processes may be used to prepare various metal oxide films, including, but not limited to, indium oxide, tin oxide, indium-tin oxide, indium-zinc oxide, indium-zinc-tin oxide, indium-cadmium oxide, and doped variations of these oxides. ALD is preferably used to reactively form the transparent conducting oxide (TCO) films with a high degree of control of the chemistry, as well as forming the desired layers more rapidly as well as depositing the oxide layers onto substrates with a high aspect ratio (e.g, greater than 1:100) and various porous materials, including polymers. Various TCO films may be formed, including indium oxide and indium-tin oxide (ITO). In particular embodiments, a precursor of cyclopentadienyl indium is used for preparing indium oxide and with tetrakis (dimethylamino) tin for preparation of tin oxide films and combination thereof in preparation of ITO.

Reactive preparation of the films is achieved by introduction of multiple reactants as part of an alternating exposure of at least one of the metal precursors. In various embodiments the reactants comprise different oxidizers, for example, oxygen and water. In other embodiments, the reactants may comprise various different reducing agents. Thus, in contrast to a traditional ALD cycle of alternating exposures of a metal precursor followed by a single reactant, the present processes utilize alternating exposures of a metal precursor and a combination of different oxidizing or reducing precursors. In various embodiments, the combination of different oxidizing or reducing precursors is sequential, while in other embodiments the combination is simultaneous. Multiple oxidizing or reducing precursors can provide significant synergistic advantages in terms of TCO film growth rate, conductivity and other material properties compared to processes that rely on a single oxidizing/reducing precursor. For example, acceptable film growth rate for ITO production may be obtained utilizing a combination of different oxidizers, whereas when either oxidizer is utilized on its own a negligible ITO growth rate is observed.

The number of cycles of each component and time of each cycle can be adjusted to achieve a desired deposition result. Various dopants can also be added as part of the preparation process to produce a wide variety of optical and electrical characteristics for the product film. The resulting films have wide application and may be integrated in various systems, for example, flat panel display devices and photovoltaic systems.

In one embodiment, a method of forming a light transmitting and electrically conducting metal oxide film on a substrate by performing a plurality of atomic layer deposition (ALD) cycles comprises exposing the substrate within the deposition chamber to a first metal precursor comprising cyclopentadienyl indium. The method further comprises exposing the substrate to a first oxidizing reactant and a second oxidizing reactant, each of which facilitate formation of a monolayer of indium oxide on the substrate. In certain embodiments, the deposition process is conducted at a deposition temperature selected to yield an average indium oxide film growth rate of at least about 1.0 Angstrom per ALD cycle over the plurality of ALD cycles.

In another embodiment, a method of preparing a light transmitting and electrically conducting oxide (TCO) film using atomic layer deposition (ALD) comprises providing a first metal precursor capable of forming a TCO film on a substrate and providing a plurality of oxidizing reactants selected to facilitate growth of the TCO film on the substrate when the plurality of oxidizing reactants are used in combination with each other. The method further comprises performing a number of ALD cycles at a deposition temperature to form the TCO film on the substrate. Each ALD cycle comprises exposing the substrate to the first metal precursor for a first predetermined period and exposing the substrate to the plurality of oxidizing reactants for at least one additional predetermined period. The growth rate of the TCO film is enhanced by exposure of the substrate to the combination of the plurality of oxidizing reactants.

In yet another embodiment, a method of preparing ITO through monolayer deposition of indium oxide and tin oxide using atomic layer deposition comprises exposing a substrate to a first metal precursor of cyclopentadienyl indium and exposing the substrate to a first oxidizing reactant and a second oxidizing reactant. The first oxidizing reactant and the second oxidizing reactant are selected from the group consisting of water and oxygen. The method further comprises exposing the substrate to a second metal precursor comprising tin and exposing the substrate to a third oxidizing reactant selected to facilitate formation of tin oxide on the substrate. The ratio of indium to tin is selected to obtain a light transmitting and electrically conducting ITO film. In certain embodiments, the third oxidizing precursor may be different than the first and the second oxidizing precursors or may be the same as one of the first and the second oxidizing precursors.

These and other objects, advantages, and features of the invention, together with the organization and manner of operation therefore, will become apparent from the following detailed description when taken in conjunction with the accompanying drawings, wherein like elements have like numerals throughout the several drawings described below.

DETAILED DESCRIPTION OF EMBODIMENTS

Figure 1:
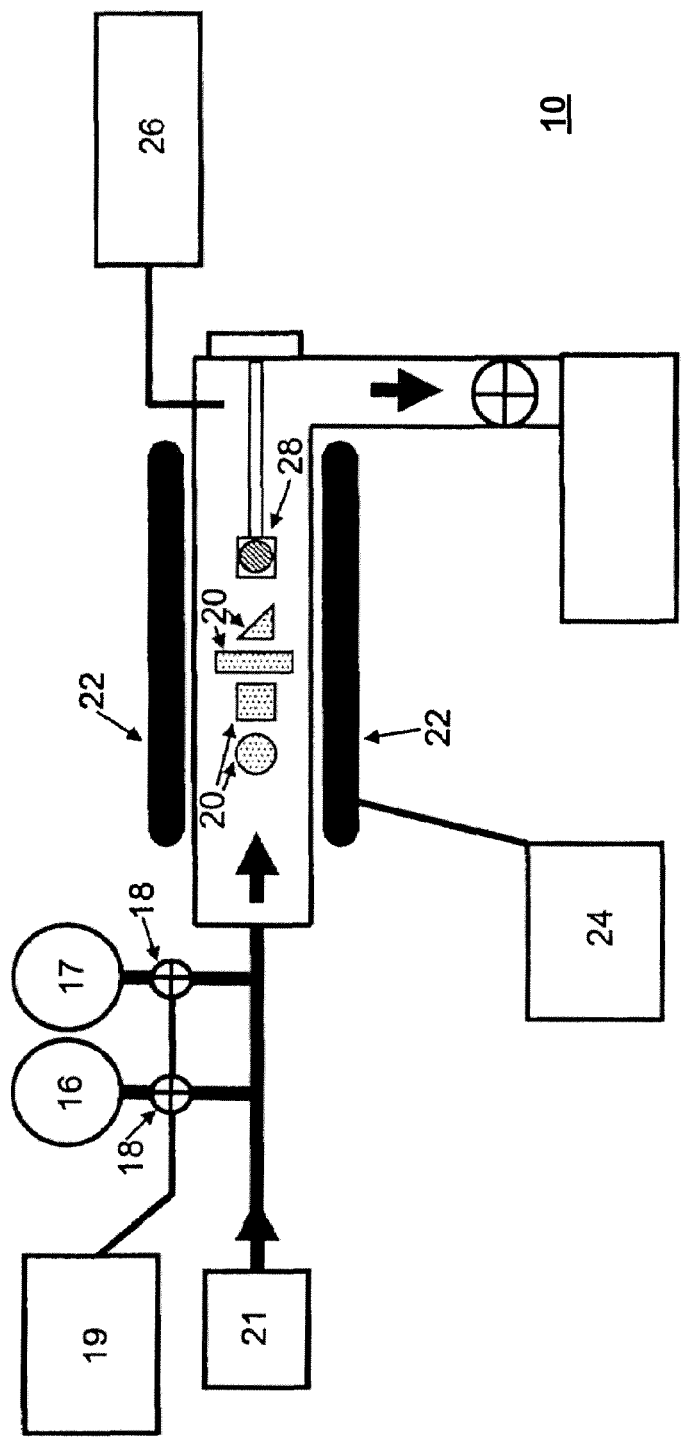
FIG. 1 is a schematic of a system for producing a light transmitting conducting metal oxide film.

According to one embodiment, a system for preparing a conducting oxide film in accordance with the present invention is indicated generally at 10 in FIG. 1. The system 10 comprises a conventional atomic layer depositing ("ALD") apparatus, such as described in U.S. Pat. No. 4,058,430, which is incorporated by reference herein. Other known ALD deposition systems are also useable. In a particular embodiment, the deposition chamber includes a flow tube 5 cm in diameter and 60 cm long with a leading edge conical transition from a 0.6 cm SST reactant gas manifold. The axial position in the tube reactor was defined by the coordinate x, with the origin x=0 located at the end of the transition where the ID becomes 5 cm A plurality of substrates 20 are located within the deposition chamber of the system 10. The system 10 may include various monitoring and measurement devices, such as a mass spectrometer 26 and quartz crystal microbalance 28. In an embodiment, a quartz crystal microbalance (QCM) located at x=30 cm was used for in-situ measurements during indium oxide growth. The QCM is a modified Maxtek BSH-150 bakeable sensor with an AT-cut quartz sensor crystal with polished front face (Colorado Crystal Corp. No. CCAT1BK-1007-000). The modifications to the sensor prevent access of the ALD reactant gases to the sensor interior to provide a one-side only deposition on the quartz crystal. A quadrupole mass spectrometer (QMS) (Stanford Research Systems RGA300) was also used during in-situ QCM measurements as well as during deposition onto samples. The inlet to the QMS is a 35 micron orifice located near the reactor tube wall at x=70 cm. The orifice separates the ALD chamber at about 1 Torr from the QMS which is held at about $1 \times 10^{-6}$ Torr by a 50 l/s turbomolecular drag pump.

The system 10 can include various sources for precursor vapors. The sources can be in gaseous, solid, or liquid form, but the partial pressure of the precursor is typically adjusted by heating, cooling, or pressure regulation to be preferably in the range of approximately 0.01 to 10 Torr which is appropriate for reaction and deposition. The system 10 can therefore include precursor sources 16 and 17 as well as additional precursor sources controlled by valves 18 and a valve controller 19. The system 10 can further include a purge gas source 21, which may be an inert gas source (e.g., $N_2$) which flows in the direction indicated by the arrows in FIG. 1. The system 10 can also include a heater 22 operated using a control 24.

The ALD of TCO films was performed using a modified form of a normal ALD cycle. Under a normal ALD operating scheme, just one metalorganic compound and one oxidizing/reducing reactant is used in the ALD cycle. This typical ALD operating cycle can be described as A/B/A/B/A, where A represents the metalorganic compound and B represents the oxidizing/reducing reactant. Under the typical ALD cycle, a purge period follows each exposure of A and B. In contrast to the conventional ALD cycle, the present process departs from usual practice and utilizes a plurality of different oxidizing/reducing agents, which may be represented as B1, B2, B3, . . . , Bn.

The modified multi-oxidizing/reducing agent ALD process may be carried out in a number of modes. Modes include combinations of multiple different oxidizing/reducing agents that may be used sequentially, simultaneously, and combinations thereof. Each of the different oxidizing/reducing agents or reactants may be selected to facilitate formation or growth of the metal oxide or other metal film during the ALD process. Additionally, each oxidizing/reducing reactant may facilitate the process via distinct mechanisms. As used herein, the terms facilitate and further facilitates mean that the oxidizing/reducing agent, reactant or other agent is vital to the film growth process and performs a necessary function for continued film growth. Still further, in various embodiments, the oxidizing/reducing agents are selected such that the metal oxide or metal film growth may be inhibited, substantially precluded, or precluded if the ALD process were to be carried out with less than all of the selected oxidizing/reducing agents or if only one the oxidizing/reducing agents was to be utilized in the process. Although various reactants when used alone perform poorly and are characterized by low growth rates of TCO or no growth, growth rates may be significantly increased when those same reactants are used in combination with each other in an ALD cycle. Accordingly, the oxidizing/reducing reactants are selected for their synergistic effect to promote growth and/or formation of the metal containing film when utilized within an ALD cycle.

For example, in a process utilizing two different oxidizing/reducing agents, B1 and B2, the ALD cycle may be conducted three different ways or in three different modes: (i) simultaneous exposure (SE), designated A/(B1+B2), (ii) ordered exposure where a B1 only exposure is followed by a B2 only exposure, designated A/B1/B2 (B1/B2), and (iii) reversed exposure where a B2 only exposure is followed by a B1 only exposure, designated A/B2/B1 (B2/B1). It will be appreciated that additional exposure combinations and modes are available when the number of oxidizing/reducing agents exceeds two.

In a particular two oxidizing agent embodiment, a combination of oxygen and water is used. Oxygen is designated the first agent B1 and water is designated the second oxidizing agent B2. Accordingly, in this scenario, a simultaneous exposure (SE) mode of A/(B1+B2) utilizes a simultaneous exposure of oxygen and water following the A portion of the cycle; oxygen is followed by water in the A/B1/B2 ordered exposure mode, which is designated (OW); the reversed exposure mode utilizes water followed by oxygen A/B2/B1, which is designated (WO).

By way of an example of a particular multiple oxidizer reactant process, the system 10, as described above and depicted in FIG. 1, was utilized to prepare ALD films of indium oxide using the modified two oxidizing/reducing agent ALD cycle. In particular, samples were prepared using oxygen (B1) and water (B2) as the two oxidizing agents. Ultrahigh purity nitrogen carrier gas (Airgas 99.998%) was continuously flowed through the reactor at 360 sccm and a pressure of 1.1 torr. Four heat zones maintain temperature control (±3° C.) in the deposition zone. Cyclopentadienyl indium (InCp) (Strem 99.999%+ electronic grade) was loaded into a stainless steel bubbler under an inert $N_2$ atmosphere. During exposure to InCp, 90 sccm of the $N_2$ carrier gas flow was diverted through the bubbler which was heated to 40-45° C. Ultrahigh purity oxygen (Airgas 99.995%) flowing at 200 sccm was used to provide the oxygen (B1) and water vapor (B2) was fed from the head space of a DI water reservoir.

The indium oxide samples were prepared utilizing an InCp exposure of 2 or 3 seconds and a water and/or oxygen exposure for 4 seconds under the three modes: simultaneous (B1+B2), ordered exposure (B1/B2), and reversed exposure (B2/B1). A purge time of 5 seconds with $N_2$ was used between exposures. Each sample received 300 ALD cycles resulting in indium oxide films of about 30-40 nm in thickness. In addition to preparing indium oxide using the two oxidizing agents, depositions were also performed, for comparative purposes, using a conventional cycle with a single oxidizing reactant (A/B) with just water (W) or just oxygen (O). The various modes for the exemplary oxygen and water ALD are thus designated: SE, WO, OW, W and O.

Various material parameters of the resulting films were evaluated to assess process performance. The axial variation of deposited film thickness was evaluated by preparing indium oxide films deposited onto Si(001) coupons placed on an aluminum tray at the axial positions x=0, 10, 20, 30 and 40 cm. A 1.9×1.9 cm fused silica coupon was placed at x=20 cm immediately adjacent to but downstream of the Si(001) coupon. The fused silica coupon was held along its axial edges and elevated above the tray by 0.5 cm so that films would grow uniformly on both sides of the coupon to facilitate UV-Vis transmission evaluation measurements. For all samples, a 2.0 nm aluminum oxide film was deposited prior to the indium oxide film using 2 second exposure times for trimethyl aluminum and water and 5 second purge times. An Alpha-SE ellipsometer (J.A.Woolam Co.) was used to measure the thickness of indium oxide films deposited onto the Si(001) coupons.

Additionally, a deposition of 60 cycles using the SE mode was made onto mesoporous silica gel to provide a sample for examination with transmission electron microscopy (TEM). Exposure times of 10 seconds were used for both InCp and oxygen/water which provided enough penetration in the porous silica particles to enable easy location during TEM.

Figure 2B:
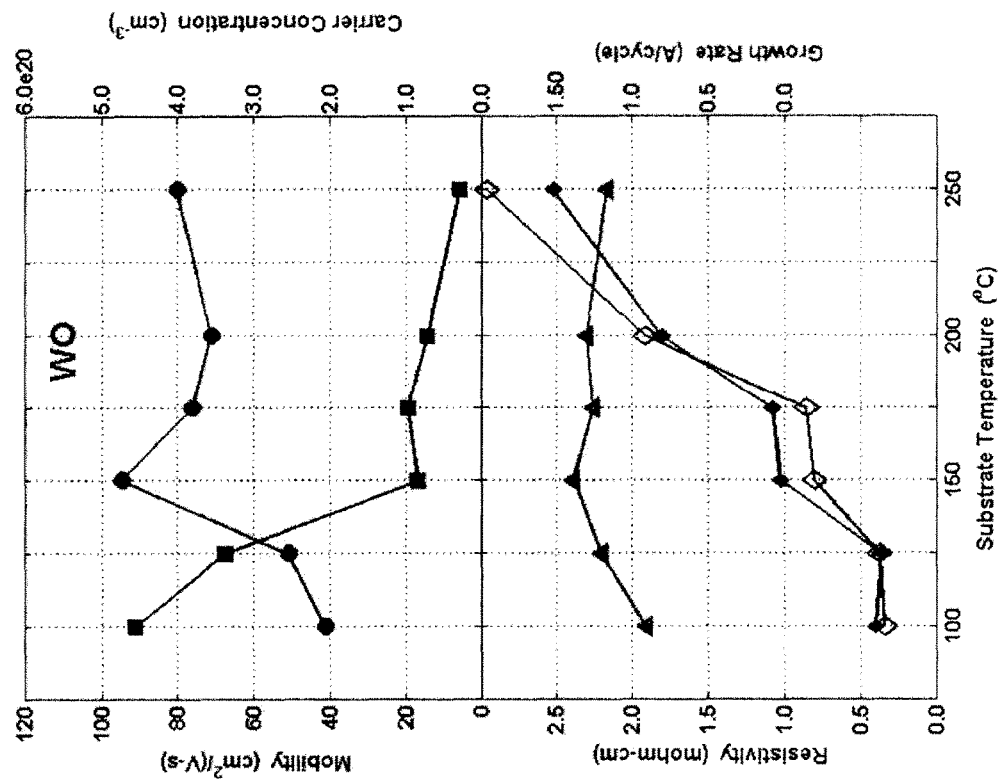
FIGS. 2a-2c are plots illustrating the growth rate (closed triangles), resistivity measured by 4-point probe (closed diamonds) and by a Hall probe (open diamonds), mobility (closed squares) and carrier concentration (closed circles) for indium oxide thin films grown using cyclopentadienyl indium, water and oxygen using deposition modes of simultaneous exposure of water and oxygen (2a); water exposure followed by oxygen exposure (2b); and oxygen exposure followed by water exposure (2c)
Figure 2A:
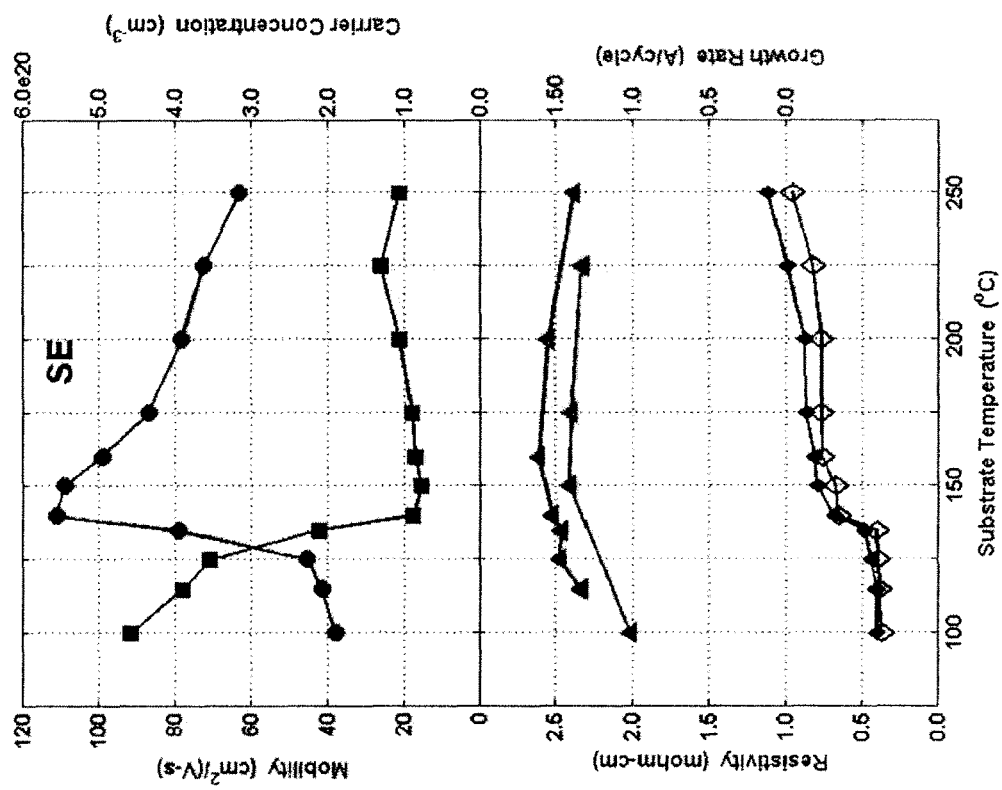
Figure 2C:
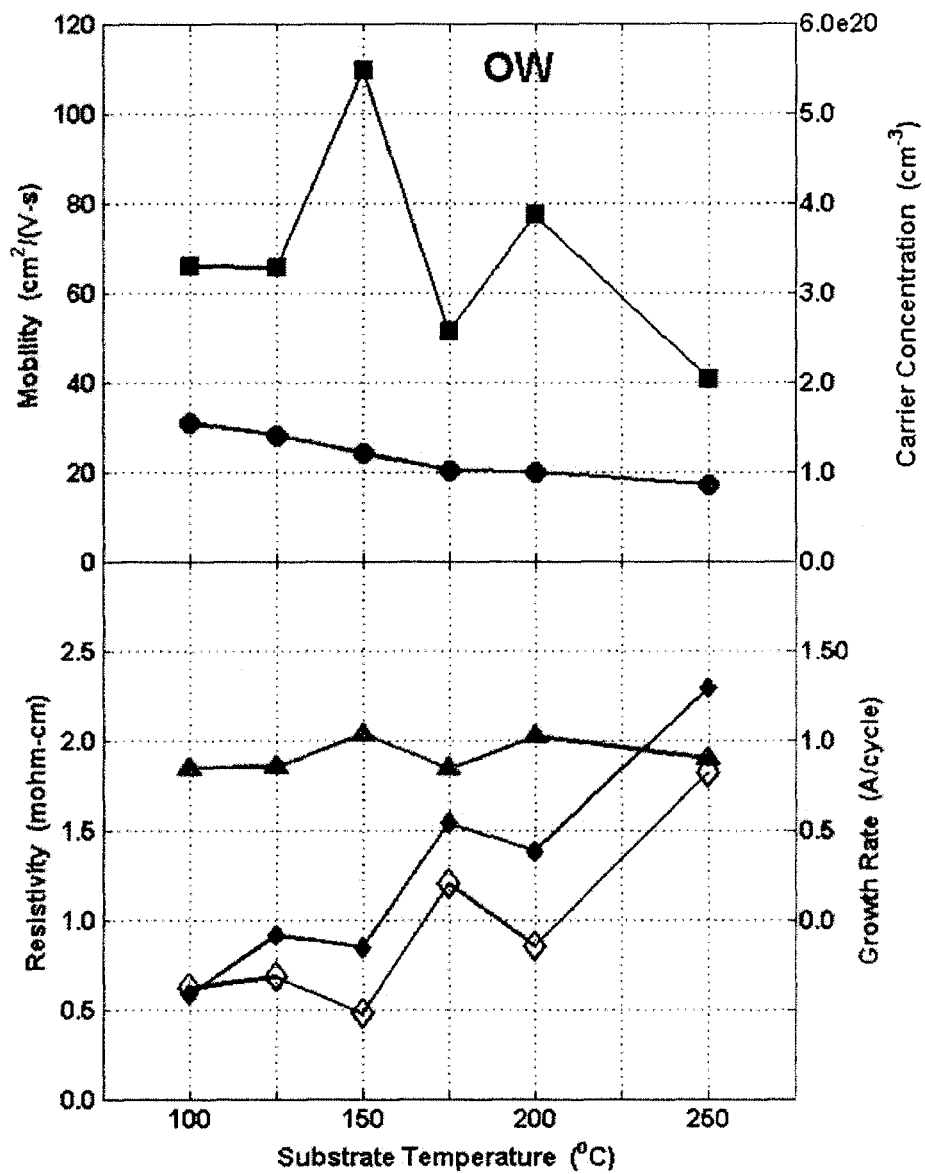

The combination of water and oxygen enabled the deposition of indium oxide films using cyclopentadienyl indium (I) as the metal precursor in all three modes SE, WO and OW. FIGS. 2a-2c show the growth rate, resistivity, carrier mobility and carrier concentration for the SE, WO and OW modes respectively. The axial uniformity of the depositions was measured using the multiple Si(001) coupons located at the different locations described above. All of the reported values of growth rate are those observed for the x=20 cm position within the tube reactor. However, the axial variation over the 40 cm sample zone was found to be less than 3% for all three water and oxygen modes SE, WO and OW.

The best performing of the three modes (SE, OW and WO) was the SE simultaneous exposure mode, which gives the highest growth rate over the entire temperature range. For the SE mode, InCp exposure times of 2 or 3 seconds were used. Both exposure times show a maximum growth rate at about 160° C. with the highest growth rate of 0.16 nm/cycle at a deposition temperature of about 160° C. While there is a greater growth rate for the 3 second InCp exposure time, there is no corresponding trend in the resistivity data while the axial variation was also nominal. Shorter exposure times could be significant in improving efficiency in industrial applications where better InCp utilization is achieved at 2 seconds vs. 3 seconds. The indium oxide film growth obtained using the WO mode shown in FIG. 2b is similar to the SE mode, with a maximum growth rate occurring at a deposition temperature of about 160° C. but with lower growth rates lying just below those for 2 second exposures in the SE mode. A distinctly different growth rate versus temperature is observed for the OW mode with a relatively constant 0.1 nm/cycle growth rate over the entire temperature range depicted.

The range of temperatures investigated was 100-250° C. and the $In_2O_3$ growth rate was found to be acceptable (nearly 1 Angstrom per cycle or higher) over this full temperature range. The $In_2O_3$ growth at temperatures below 200° C. is remarkable because previously using just ozone as the oxidizing agent yielded negligible $In_2O_3$ growth below 200° C. The lowest temperature for acceptable $In_2O_3$ growth is likely to be about 45° C. because the vaporization temperature utilized for the InCp precursor is 40° C. and a slightly higher growth temperature is required to prevent condensation of the InCp. The highest temperature for acceptable $In_2O_3$ growth is likely to be approximately 425° C. because this is the temperature for the onset of thermal decomposition of the InCp precursor and thermal decomposition produces thickness nonuniformities.

In contrast to the above multi-oxidizer modes, the single-oxidizer oxygen only (O) and water only (W) modes yield very low growth rates at moderate deposition temperatures of 250-275° C. Significantly, the 0 and W depositions performed at lower deposition temperatures of 125° C., 175° C. and 225° C. yielded virtually zero indium oxide growth. Thus, a unique reaction mechanism is associated with the multi-reactant modes with B1 and B2 using water and oxygen. Additionally, these separate mechanisms can affect the crystallization behavior of the film under the various modes SE, WO and OW.

With reference to FIGS. 2a-2c, the resistivity, mobility, and carrier concentration that were measured show distinct trends for each of the three growth modes. Resistivity, carrier mobility, and carrier concentration were measured on the fused silica coupons using a Hall effect probe and using a four-point resistivity probe. The indium oxide deposited on the sidewalls of all of the fused silica coupons was removed by sanding before making Hall probe measurements to ensure that the measurements were not affected by the coating on the back side. For both the SE and WO modes there is significant change in all these properties near 140° C. which is closely related to the crystallization of indium oxide in the growing films. Most notable for the OW mode, is the low mobility over the entire temperature range. At the lowest deposition temperature of 100° C. both the SE and WO modes give the same values of resistivity, mobility and carrier concentration, ($\rho$=3.4–3.6×10$^{-4}$ ohm-cm, $\mu$=38-41 cm/(V-s) $n_e$=4.5×10$^{20}$ cm$^{-3}$), while the OW mode yields slightly higher resistivity and lower mobility and carrier concentration.

As the growth temperature is increased through the crystallization temperature, the SE mode shows a large jump in mobility from 38 to 111 cm/(V-s), while the carrier concentration drops to a minimum of 0.8×10$^{20}$ cm$^{-3}$. As the growth temperature is further increased to 250° C. the mobility in the SE mode steadily declines, while for the WO mode this decline reverses and starts to increase at the highest temperature. Above the crystallization temperature, both the SE and WO modes have a similar carrier density of about 1×10$^{20}$ cm$^{-3}$. The resistivity in the SE mode shows two essentially constant values, below and above the crystallization temperature. On the other hand, the WO mode gives a steadily increasing resistivity above the crystallization temperature.

The transport properties of films grown using the OW mode show low mobility over the entire temperature range in contrast with the SE and WO modes. The carrier concentration stays relatively high and resistivity shows a similar trend as the WO mode. The result is indicative that the transport properties are closely linked with the crystal properties of the films as discussed in more detail below.

Figures 3A, 3B, 3C:
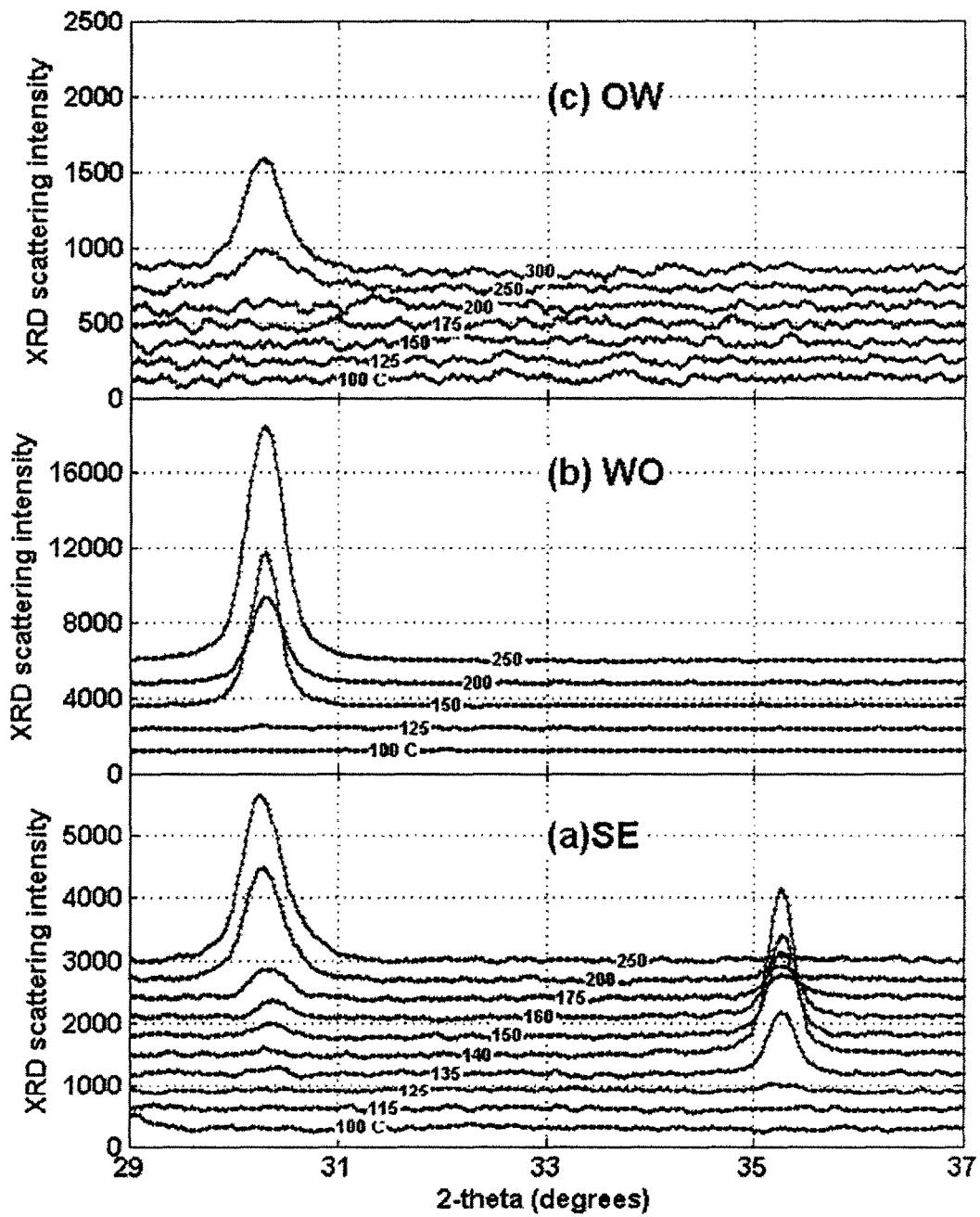
FIGS. 3a-3c are plots of X-Ray diffraction (XRD) scattering intensity patterns of the samples of FIGS. 2a-2c taken at 2 theta at various deposition temperatures for simultaneous exposure of water and oxygen (3a); water exposure followed by oxygen exposure (3b); and oxygen exposure followed by water exposure (3c)
Figure 4:
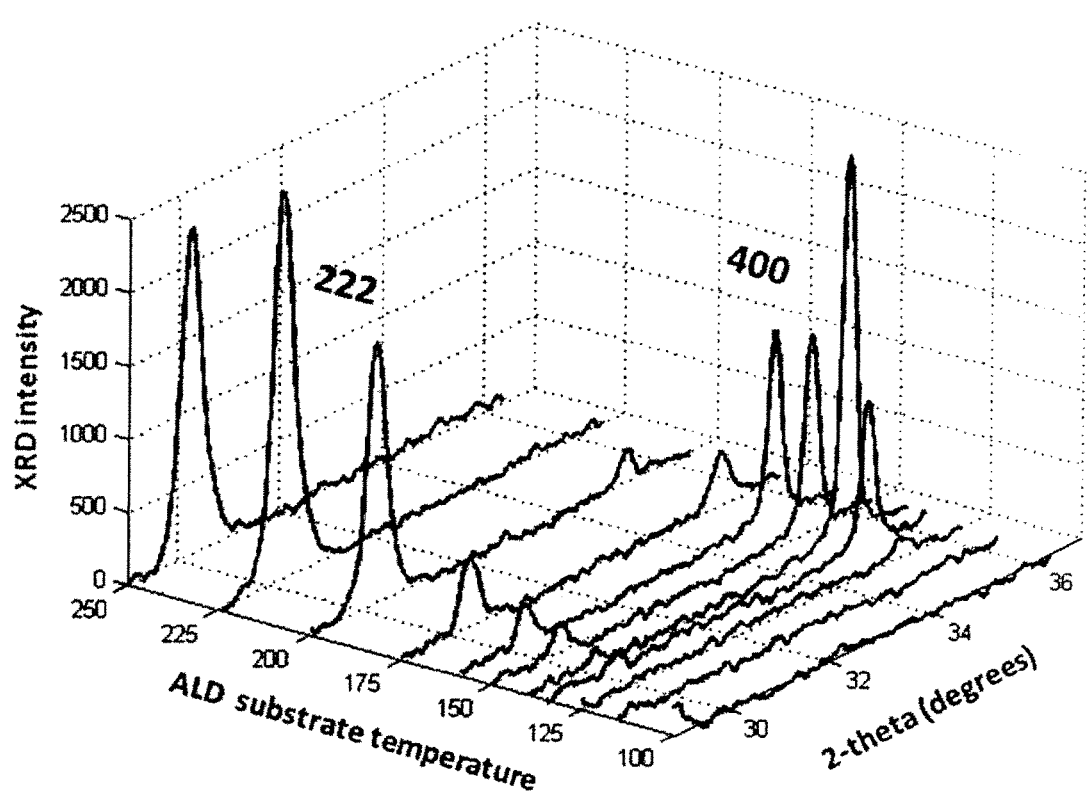
FIG. 4 is a three-dimensional plot of XRD scattering intensity spectra of samples prepared using simultaneous exposure of water and oxygen at various deposition temperatures.

Under lower temperature conditions, from room temperature to about 160° C., the deposition of indium oxide exhibits an amorphous to crystalline transition at about 150° C. However, even in amorphous low temperature films, $In_2O_3$ exhibits low resistivity, indicating that the electronic structure of indium oxide does not require a crystallized state to exhibit conducting properties. With reference to FIGS. 3 and 4, XRD characterization results are shown for films prepared using each of the deposition modes. The XRD measurements were made on a diffractometer using Cu Kα X-rays (Rigaku Miniflex Plus). For each deposition, XRD scans were performed on the fused silica coupon over the 2-theta range of 29-39 degrees which encompasses the two strongest peaks (400 and 222) of the cubic indium oxide phase.

FIG. 3 can be used to understand the relative crystallization behavior of the three modes while FIG. 4 provides a clearer picture of the complex temperature dependence of crystallinity in the SE mode. Several noteworthy features are apparent from FIG. 3. In particular, the OW and WO modes give films that are a highly textured along the 222 direction. The SE mode exhibits a relatively strong 400 texture near the crystallization temperature which then changes to the 222 texture at higher deposition temperatures. In the SE mode the 400 peak is present at deposition temperatures as low as 125° C. The lowest degree of crystallization occurs in the OW films where the 222 peak first occurs at a deposition temperature of 250° C. This is in contrast to the WO mode where crystallization begins at the crystallization temperature. At a deposition temperature of 250° C. the magnitude of the 222 peak is 12,000 compared to 2,600 for SE and 750 for the OW mode.

In general, in TCO materials larger crystal domains can increase conductivity by reducing the number of carrier scattering sites but at the same time can also lower conductivity by reducing the number of electron generating defects. In ITO materials, high conductivity is typically achieved by doping to create fixed carrier generation sites while high temperature annealing is used to create the high mobility of a highly crystalline state.

The lowest resistivity for the indium oxide films prepared using the SE, OW and WO modes occurred in films in the amorphous state where a large carrier concentration more than compensates for the low mobility resulting from the amorphous state. In both the SE and WO modes the carrier concentration decreases sharply as the mobility rises rapidly, leaving the resistivity essentially constant. This is consistent with increasing crystallization that increases mobility at the expense of carriers which are of a vacancy type. However, the mobility generally declines with increasing deposition temperature. While this may seem to contradict the notion that high temperatures generally lead to better crystallization, the present processes may increase the number of individual crystallites at higher deposition temperatures. This would be consistent with the relatively steady carrier concentration observed from 150-250° C. The 250° C. WO sample where a mobility of 80 cm/(V-s) is observed, which is the highest mobility observed at that deposition temperature, is an exception to the general trend. This result coincides with the strongest observed 400 peak for that sample. In the SE mode a steady decline in the mobility occurs from 140° C. and onward. In the OW mode the mobility varies distinctly lower than the other modes.

Simultaneous QMS and QCM measurements were made during indium oxide deposition at deposition temperatures of 125° C. and 175° C. for each of the three modes, SE, OW, and WO. These temperatures were selected to be below and above the amorphous-to-crystalline transition temperature of 150° C. to detect possible changes in growth mechanism with crystallinity. The QMS data were also gathered during a number of the sample depositions. A quadrupole mass spectrometer (QMS) (Stanford Research Systems RGA300) was located at a 35 micron inlet orifice located near the reactor tube wall at x=70 cm.

Figure 5:
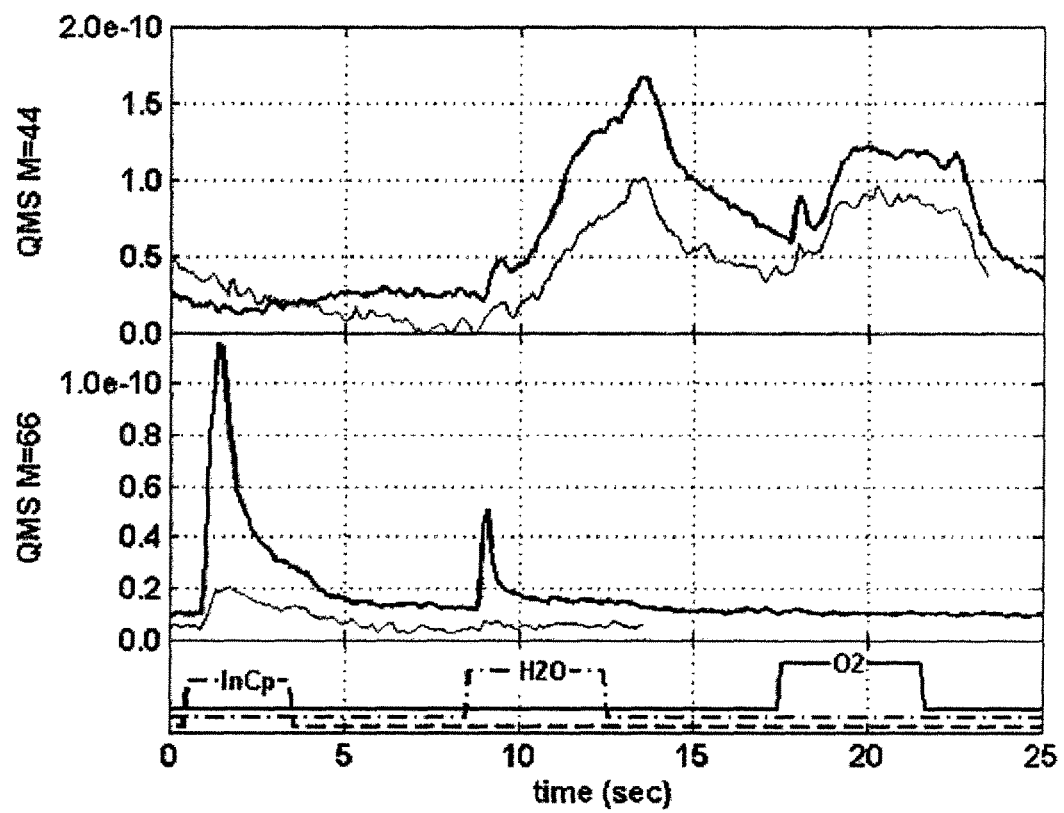
FIG. 5 is a plot of quadrupole mass spectrometer (QMS) data for mass-to-charge ratios M=44 and M=66 for indium oxide thin films grown at a deposition temperature of 175° C. through sequential exposures of cyclopentadienyl indium, water and oxygen.

In all modes (SE/WO/OW) of indium oxide depositions, the predominant reaction product was cyclopentadiene, observed at mass-to-charge ratio M=66 on the QMS. On the other hand, in a typical A/B deposition process using InCp/$O_3$, $CO_2$ is observed at M=44 as a significant product peak during the $O_3$ exposures. However, $CO_2$ was not observed in the various multi-oxidizer A B1 B2 modes. FIG. 5 shows M=66 and M=44 QMS profiles taken during a WO deposition mode at a deposition temperature of 175° C. The background profiles were obtained by interrupting steady state growth to apply multiple consecutive exposures of InCp alone or ($H_2O+O_2$) alone. This procedure differentiates the portion of the QMS signal which is due to true products of the surface reactions from background signals due to InCp in the feed gas and from $CO_2$ generated inside the QMS. The majority of the M=66 signal comes from surface reactions but the $CO_2$ cannot be attributed to the surface reactions. The quantity of $CO_2$ is consistent which each cyclopentadiene molecule having five carbon atoms to burn inside the QMS. Because there is no distinct product spike at the leading edges of either the $O_2$ or $H_2O$, exposures, the $CO_2$ is generated primarily by combustion of Cp on the hot filament in the QMS.

Figures 6A, 6B, 6C:
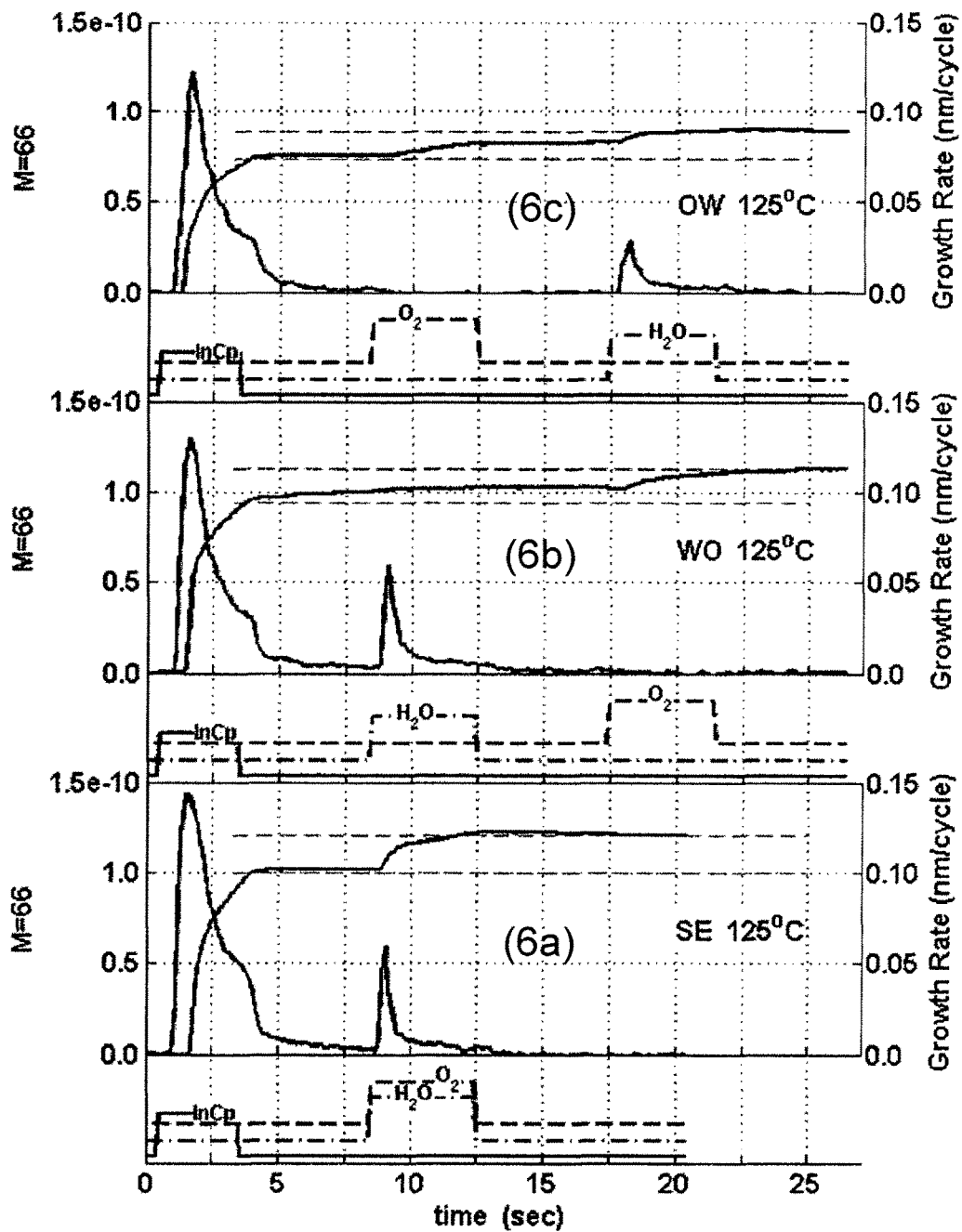
FIGS. 6a-6f are simultaneous plots of quartz crystal microbalance (QCM) and QMS signals averaged over ten cycles showing growth rate and M=66 for deposition modes of simultaneous exposure of water and oxygen (6a and 6d); water exposure followed by oxygen exposure (6b and 6e); and oxygen exposure followed by water exposure (6c and 6f), where FIGS. 6a-6c and FIGS. 6d-6f correspond to deposition temperatures of 125° C. and 175° C., respectively.
Figures 6D, 6E, 6F:
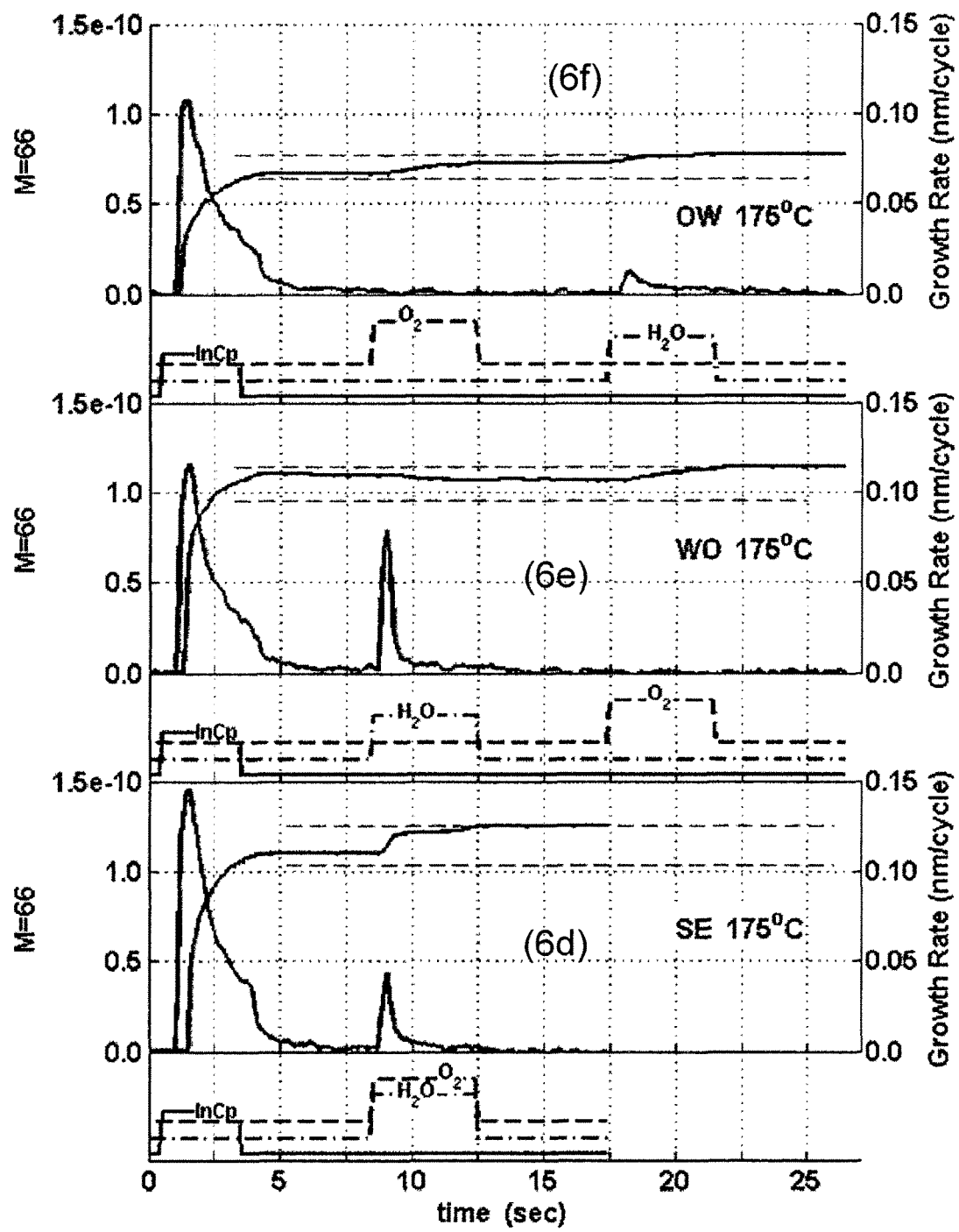
Figure 7:
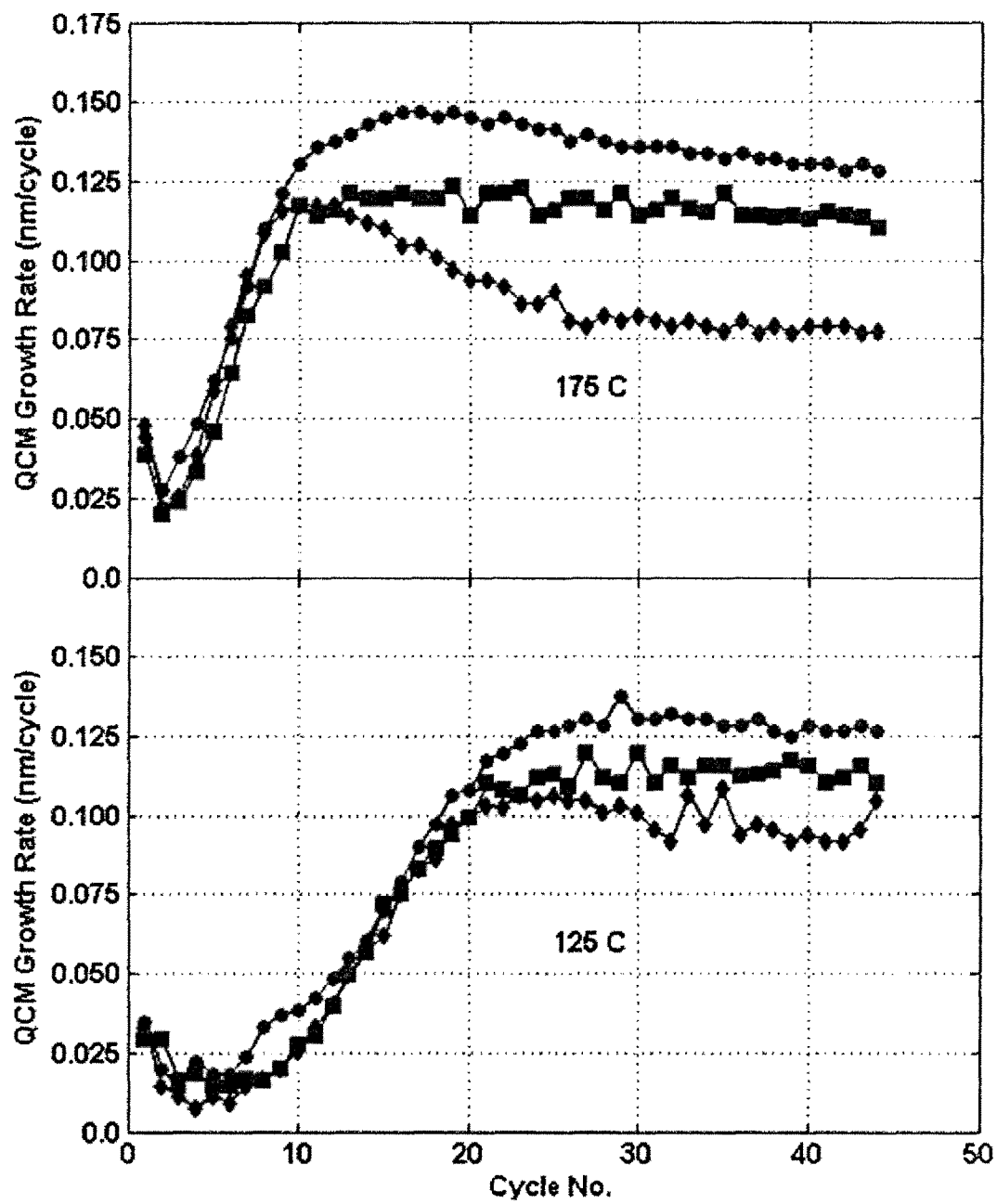
FIG. 7 is a plot of growth rate G obtained from quartz crystal microbalance (QCM) measurements for the transient portion of the indium oxide growth on an aluminum oxide surface as a function of ALD cycles at 175° C. (upper plot) and 125° C. (lower plot) in the SE mode (closed circles), the WO mode (closed squares), and the OW mode (closed diamonds)

The growth rate of deposited indium oxide was also simultaneously measured by QCM-QMS by first depositing alumina onto the QCM crystal using trimethyl aluminum (TMA)/$H_2O$ until a constant growth rate of 0.1 nm/cycle was observed for at least 20 cycles. This was followed by sample depositions in each of the multi-oxidizer modes SE, OW and OW. The process was performed at deposition temperatures of 125° C. and 175° C. Each data set was further processed to generate (a) steady state cycle profiles of the QCM and QMS data and (b) transient growth rate data from the start of each data set (FIG. 7). For the steady-state cycle profiles, the last ten cycles of the 60-70 cycle data sets were averaged and are depicted for deposition temperatures of 125° C. (FIGS. 6a-6c) and 175° C. (FIGS. 6d-6f). The averaged steady state profiles were quantitatively analyzed by first subtracting the InCp background and then integrating to find the areas of the M=66 peaks.

Figure 8:
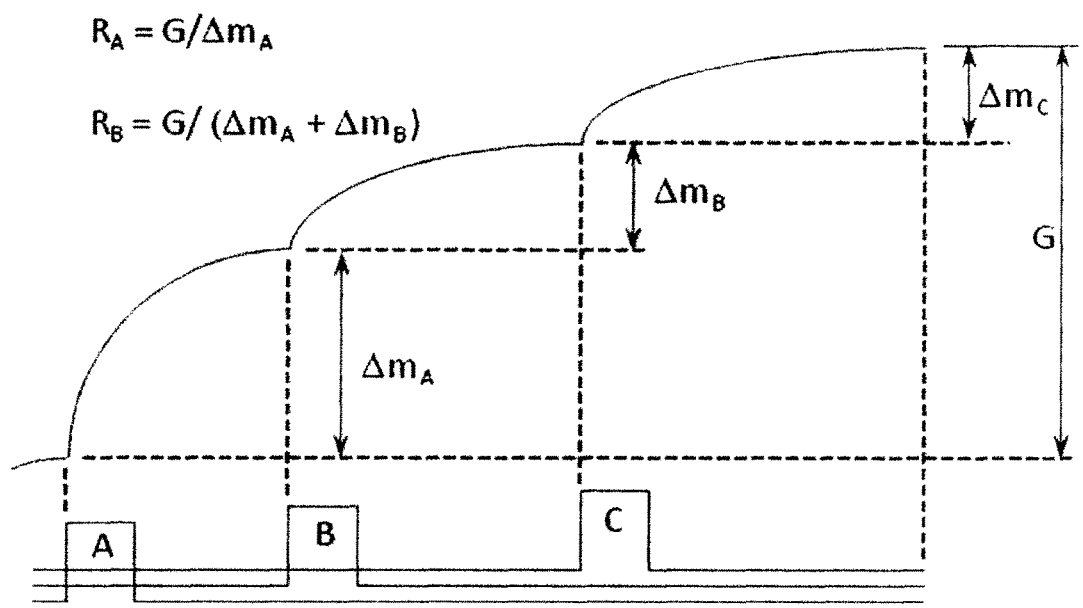
FIG. 8 is a schematic representation of QCM reaction parameters for an ALD process using a combination of oxidizing reactants.

With reference to FIG. 8, additional parameters are defined to analyze the product distribution during the ALD half reactions. In particular, G is defined as the mass gain for a complete single deposition cycle. The ratios $R_A=G/(\Delta M_A)$ and $R_B=G/(\Delta M_A+\Delta M_B)$ characterize the mass gain after completion of the A and B steps, respectively, of the A B1 B2 reaction cycle. The ratio $R_A$ relates to the cyclopentadiene surface concentration. For example, if it is assumed that every ligand associated with an InCp adsorption to the surface is subsequently liberated by reaction with a surface hydrogen (hydroxyl), the value of $R_A$ is calculated as $R_A=MW(In_2O_3)/MW(In_2)=277.6/229.6=1.21$. Similarly, if it is assumed that during the InCp adsorption step that no Cp ligands are liberated and remain attached to the adsorbed InCp molecule, the value of $R_A$ is calculated as $R_A=MW(In_2O_3)/2*MW(InCP)=277.6/359.9=0.77$.

Figure 9:
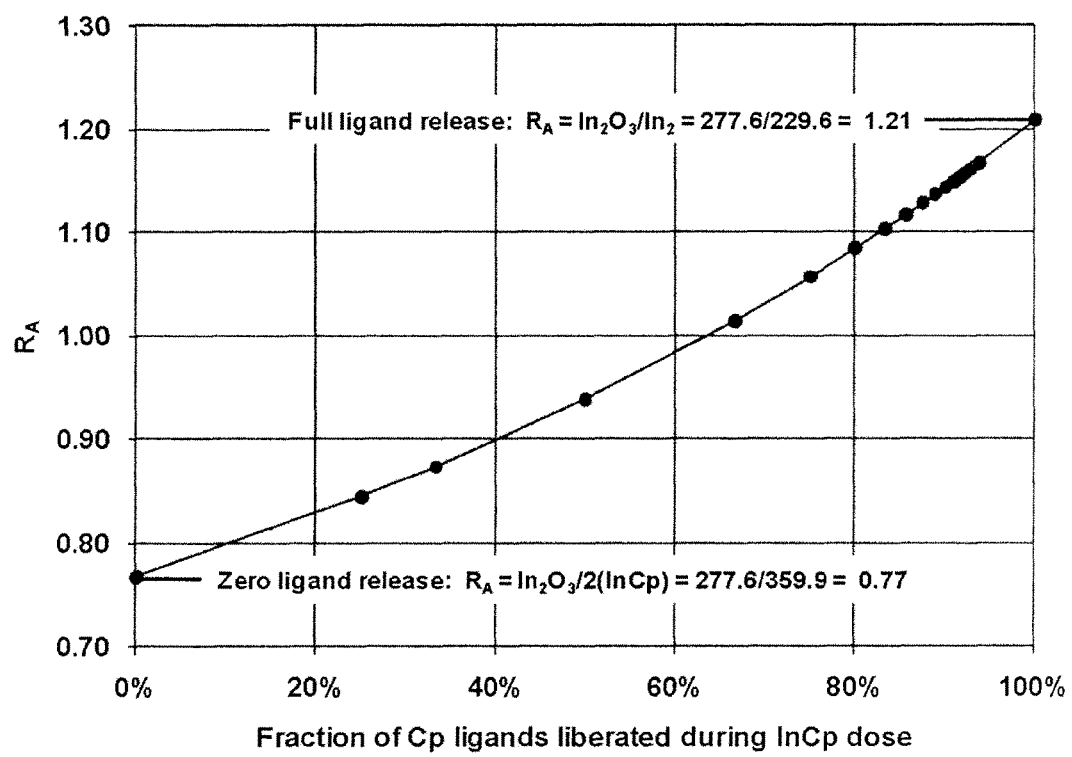
FIG. 9 is a plot of values of the parameter $R_A$ computed as a function of the fraction of Cp ligands that are liberated in an InCp ALD exposure step.

In general, all possible values of $R_A$ can be computed as a function of the fraction of the Cp ligands that are liberated in the InCp exposure step and shown FIG. 9. The plot of FIG. 9 can be used to interpret the values of $R_A$ observed during the QCM measurements provided in Table I. The value of $R_A$ is 1.14-1.16 for all modes (SE, OW, WO) except for the WO mode at 175° C. where RA=1.06. By calculation or by looking to FIG. 9, the finding $R_A$=1.14-1.16 implies liberation of 89% to 92% of the Cp ligands.

TABLE I

|  | 125° C. | | | 175° C. | | |
| --- | --- | --- | --- | --- | --- | --- |
|  | SE | WO | OW | SE | WO | OW |
| $A_{66}$ | 2.58E-09 | 2.14E-09 | 1.57E-09 | 218E-09 | 1.81E-09 | 1.46E-09 |
| $A_{66, InCP}$ | 83% | 73% | 84% | 85% | 72% | 88% |
| $A_{66, H2O}$ | 17% | 27% | 16% | 15% | 28% | 12% |
| $G_{flim}$ | 1.46 | 1.19 | 0.87 | 1.4 | 1.25 | 0.84 |
| $G_{QCM}$ | 1.21 | 1.13 | 0.89 | 1.25 | 1.114 | 0.77 |
| $G_{QCM}/A_{66}$ | 4.67 | 5.27 | 5.66 | 5.73 | 6.31 | 5.29 |
| Ra | 1.16(1.21) | 1.16(1.21) | 1.15(1.21) | 1.14(1.21) | 1.04(1.21) | 1.15(1.21) |
| Rb | n/a | 1.11(1.13) | 1.08(1.06) | n/a | 1.08(1.13) | 1.05(1.06) |

Table I further indicates the partitioning of Cp ligand release during each step of a cycle. If it is assumed that all cyclopentadienyl ligands are removed as intact cyclopentadiene, then the observed intensities of the Cp peaks (areas) compare well to the QCM predictions. The observed proportions of Cp ligand release are 72-74% for the WO mode and 84-88% for the SE and OW modes which are in reasonable agreement with the QCM predicted 89-92%.

The notion that ligand release occurs only by the mechanism of intact HCp can be tested by observing the total Cp during a full ALD growth cycle. The result is shown in Table I where the ratio $G_{QCM}/A_{66}$, which would be constant if all the deposited indium occurred by intact HCp release. The observed ratio is 4.7-6.3, which is reasonably constant. Assessment of the individual contributions of water and oxygen on the film growth suggest that the indium oxide growth follows the reaction mechanism:

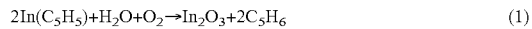

$$2In(C_5H_5)+H_2O+O_2 \rightarrow In_2O_3+2C_5H_6 \qquad (1)$$

For example, in the WO mode, most if not all cyclopentadienyl is liberated after the water exposure. Accordingly, $R_B$ is calculated as $R_B=MW(In_2O_3)/MW(In_2O)=277.6/245.6=1.06$.

With reference to FIG. 7, the plots indicate a consistent island nucleation and growth mechanism is present. Initially, the growth rate is low followed by a steady rise which then passes through a maximum before tailing off to a steady growth rate. This phenomenon is usually attributed to an island growth and coalescence mechanism, where initially growth only occurs at selected sites on the alumina surface. As the alumina surface becomes overgrown, the island morphology results is enhancement of surface area so a higher growth rate occurs for a period but diminishes as the surface becomes smooth. Notably, for each of the temperatures examined there is little difference in the evolution of the growth rate with growth mode except that the final growth rates are dependent on the mode. These final growth rates are consistent with the rates found for the films depicted in FIGS. 2a-2c. The number of cycles to reach the maximum is about 5 at the 175° C. deposition temperature, whereas 10 cycles are necessary for the 125° C. deposition temperature.

FIGS. 6a-6f show the last ten cycles averaged to reduce noise from each deposition on the QCM. The same was also done for the M=66 QMS data representing the cyclopentadiene. Across all modes and temperatures (a) the release of cyclopentadiene from the indium oxide surface occurs only in the presence of water; (b) exposure of oxygen results in about the same increase in mass; (c) during the water exposure the mass gain is inversely related to the relative cyclopentadiene QMS peak height, i.e., the higher the QMS=66 peak during water only exposure, the lower the mass gain. From the above analyses we can rationalize the need for both $H_2O$ and $O_2$ to facilitate the $In_2O_3$ ALD. The QMS shows that HCp is the only gaseous reaction product, and furthermore that the Cp ligands remaining on the surface following the InCp exposures are only released during the $H_2O$ exposures. Consequently, without the $H_2O$ the surface will remain passivated with the Cp ligands and the $In_2O_3$ can not grow. The QCM data shows a mass increase during the $O_2$ exposures yet there is no gaseous product released solely during the $O_2$ exposures. These observations are consistent with the incorporation of oxygen into the films during the $O_2$ exposures. During the $In_2O_3$ ALD, the In atoms must become oxidized from the +1 state in the InCp precursor to the +3 state in the $In_2O_3$ films. Not to be bound by theory, it is likely that this oxidation occurs only during the $O_2$ exposures. This explains why the $O_2$ is needed to facilitate the $In_2O_3$ ALD because without this oxidation, the $In_2O_3$ can not grow.

As described above, the multi-oxidizer ALD process can be used to deposit monolayers of indium oxide. Indium-tin oxide (ITO) can be formed by further including alternating exposures of a tin precursor and an oxidizing reactant so to also deposit monolayers of tin oxide on the substrate. In a particular embodiment, the tin precursor comprises tetrakisdimethylamino tin and the oxidizing reactant is hydrogen peroxide. However, other tin oxide deposition processes may used. To prepare an ITO sample, monolayers of indium oxide were formed per the A/B1B2 process and monolayers of tin oxide ($SnO_2$), were formed by ALD using alternating exposures to tetrakis(dimethylamino) tin (TDMASn) (Gelest, >95% purity) and hydrogen peroxide ($H_2O_2$, Aldrich, 30 wt % in water). The TDMASn is held in a stainless steel bubbler maintained at 40° C., and the tubing connecting the bubbler to the ALD reactor is maintained at 150° C.

By combining the multi-oxide indium oxide deposition process (A/B1 B2) and the tin oxide processes (C/B3) in the ratio of about 19:1, ITO films of high electrical conductivity and optical transparency can be prepared. Using this approach, ITO can be deposited at a growth rate of at least about 1 Angstrom per ALD cycle at a deposition temperature of less than 250° C. In particular embodiments, ITO may be deposited at a growth rate of at least about 1 Angstrom per ALD cycle at deposition temperature of between about 100° C. and less 200° C. This compares to other ALD processes using InCp or other precursors that require a deposition temperature greater than 200° C. Various dopants known in the art can also be added to further enhance conductivity and other material properties of interest. Significantly, the thickness non-uniformity of the deposited film is greatly reduced to less than 5% along both axes of the substrate in mid-size and large-area ALD coating system. For example, in one embodiment a mid-size reactor is capable of processing square substrates of more than 4 square inches of material and a large-area reactor is capable of processing at least 200 square inches of material. The multi-oxidizing/reducing agent process is applicable to other TCO systems including indium-zinc oxide, indium-zinc-tin oxide, indium-cadmium oxide, and doped variations of these oxides, and may be extended to other ALD processes.

The foregoing description of embodiments of the present invention have been presented for purposes of illustration and description. It is not intended to be exhaustive or to limit the present invention to the precise form disclosed, and modification and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of preparing a light transmitting and electrically conducting oxide (TCO) film using atomic layer deposition (ALD), comprising:

providing a first metal precursor comprising cyclopentadienyl indium capable of forming a TCO film on a substrate, the first metal precursor characterized by a vapor deposition temperature and a thermal degradation temperature wherein the deposition temperature 100° C. to 225° C.;

providing a plurality of different oxidizing reactants consisting of $O_2$ and $H_2O$ selected to facilitate growth of the TCO film on the substrate when the plurality of oxidizing reactants are used in combination with each other wherein the plurality of oxidizing reactants comprises a first oxidizing reactant and a second oxidizing reactant, wherein the first and the second oxidizing reactants are selected from the group consisting of water and oxygen;

performing a number of ALD cycles at the deposition temperature, to form the TCO film on the substrate, each ALD cycle comprises exposing the substrate to the first metal precursor for a first predetermined period and exposing the substrate to the plurality of oxidizing reactants for at least one second predetermined period, and wherein the growth rate of the TCO film is facilitated by exposure of the substrate to the combination of the plurality of oxidizing reactants.

2. The method of claim 1, wherein exposing the substrate to the plurality of oxidizing reactants is performed simultaneously.

3. The method of claim 1, wherein the TCO film is an indium-tin oxide film and the ALD cycle further comprises a tin oxide deposition step.

4. The method of claim 1, wherein the substrate comprises a polymer.

5. A method of forming a light transmitting and electrically conducting indium based metal oxide film on a substrate by performing a plurality of atomic layer deposition (ALD) cycles within a deposition chamber, each ALD cycle comprising:

exposing the substrate within the deposition chamber to a first metal precursor comprising cyclopentadienyl indium, the substrate at a deposition temperature between 100° C.-225° C.;

purging the deposition chamber with an inert purge gas;

exposing the substrate to a first oxidizing reactant consisting of $O_2$ or $H_2O$ to facilitate formation of a monolayer of indium oxide on the substrate;

exposing the substrate to a second oxidizing reactant consisting of $O_2$ or $H_2O$ and different than the first oxidizing reactant to further facilitate the formation of the indium oxide monolayer on the substrate; and purging the deposition chamber with an inert purge gas, wherein the cyclopentadienyl ligand is substantially released from the cyclopentadienyl indium on the substrate by one of the first oxidizing reactant and the second oxidizing reactant, thereby forming the indium metal based oxide film on the substrate.

6. The method of claim 5, wherein exposure of the substrate to the first oxidizing reactant and exposure of the substrate to the second oxidizing reactant is performed simultaneously and without an intervening purging of the deposition chamber with the inert purge gas.

7. The method of claim 5, further comprising an intervening purging of the deposition chamber with the inert purge gas between exposure of the substrate to the first oxidizing reactant and exposure of the substrate to the second oxidizing reactant is performed simultaneously and without an intervening purging of the deposition chamber.

8. The method of claim 7, further comprising incorporating the indium-tin oxide film into one of a display device and a photovoltaic device.

9. The method of claim 5, wherein the first oxidizing reactant is $O_2$ and the second oxidizing reactant is $H_2O$ and further comprising an intervening purging of the deposition chamber with the inert purge gas between the exposing of the substrate to $O_2$ and the exposing of the substrate to the $H_2O$.

10. The method of claim 5, wherein the first oxidizing reactant is $H_2O$ and the second oxidizing reactant is $O_2$ and further comprising an intervening purging of the deposition chamber with the inert purge gas between the exposing of the substrate to $H_2O$ and the exposing of the substrate to the $O_2$.

11. The method of claim 5, further comprising:

exposing the substrate to a second metal precursor comprising tetrakis(dimethylamino) tin;

purging the deposition chamber with an inert purge gas;

exposing the substrate to a third oxidizing reactant to facilitate formation of a tin oxide monolayer on the substrate;

purging the deposition chamber with an inert purge gas, wherein the ratio of indium oxide to tin oxide is selected such that a light transmitting and electrically conducting indium-tin oxide film is formed on the substrate.

* * * * *